United States Patent
Tsubokura et al.

(10) Patent No.: US 7,259,822 B2
(45) Date of Patent: Aug. 21, 2007

(54) IMAGE DISPLAY DEVICE

(75) Inventors: Masaki Tsubokura, Mobara (JP); Shunsuke Morishita, Mobara (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 0 days.

(21) Appl. No.: 10/679,382

(22) Filed: Oct. 7, 2003

(65) Prior Publication Data

US 2004/0070721 A1    Apr. 15, 2004

(30) Foreign Application Priority Data

Oct. 11, 2002    (JP)    ............................. 2002-299063

(51) Int. Cl.
*G02F 1/1345*    (2006.01)
(52) U.S. Cl. ........................ 349/149; 349/58
(58) Field of Classification Search ................ 349/149, 349/150, 151, 152, 58; 345/204, 205; 361/749, 361/784, 681; 439/67
See application file for complete search history.

(56) References Cited

U.S. PATENT DOCUMENTS 6,519,020 B1 *    2/2003    Cha et al. .................. 349/150

2002/0173178 A1    11/2002    Matsunaga
2004/0017536 A1 *    1/2004    Takenaka .................... 349/150

FOREIGN PATENT DOCUMENTS

JP    2002-341371    11/2002

\* cited by examiner

*Primary Examiner*—Toan Ton
*Assistant Examiner*—Tai Duong
(74) *Attorney, Agent, or Firm*—Antonelli, Terry, Stout & Kraus, LLP.

(57) ABSTRACT

An image display device includes an image display panel, a first wiring printed circuit board which is arranged in spaced relationship close to the image display panel, and a second wiring printed circuit board which is arranged to extend between the image display panel and the first wiring printed circuit board. The second wiring printed circuit board is constituted such that at least a wiring layer which allows inputting of signals thereto from the first wiring printed circuit board side and outputting of signals therefrom to the image display panel side is formed on a surface of a flexible printed circuit board. The first wiring printed circuit board includes a portion having, a width smaller than the width of the first wiring printed circuit board, disposed at a side thereof opposite to the image display panel.

31 Claims, 8 Drawing Sheets

IMAGE DISPLAY DEVICE

BACKGROUND OF THE INVENTION

The present invention relates to an image display device.

In an active matrix type liquid crystal display device, for example, there are a plurality of gate signal lines which supply scanning signals to groups of pixels and a plurality of drain signal lines which supply video signals to respective pixels to which the scanning signals are supplied.

Each pixel has a switching element which is operated in response to the supply of the scanning signal, a pixel electrode to which a signal is supplied from the drain signal line through the switching element, and a counter electrode which generates an electric field for controlling the optical transmissivity of liquid crystal that is disposed between the counter electrode and the pixel electrode.

Further, the supply of the scanning signals to the gate signal lines and/or the supply of video signals to the drain signal lines are performed by a scanning signal driving circuit and a video signal driving circuit (also referred to as signal driving circuits hereinafter), which are constituted of semiconductor devices formed by a tape carrier method and are arranged to bridge the gap between a panel and a printed circuit board.

Here, the semiconductor devices formed by the tape carrier method include an input-side wiring having input terminals and an output-side wiring having output terminals on a flexible board, wherein a semiconductor chip is mounted between the input-side wiring and the output-side wiring, such that input-side bumps thereon are connected to the input-side wiring and output-side bumps thereon are connected to the output-side wiring.

SUMMARY OF THE INVENTION

However, in the liquid crystal display device having such a constitution, since the thermal expansion coefficient of the printed circuit board is higher than the thermal expansion coefficient of the panel, stress and strain generated by the expansion of the printed circuit board are transmitted to the above-mentioned signal driving circuits.

As a result, a disconnection of the wiring layer formed in the signal driving circuit or a connection failure between the semiconductor device and the wiring layer mounted on the liquid crystal display device are likely to occur. This drawback has become more apparent with the recent increase in size of the liquid crystal display panel.

The present invention has been made in view of such circumstances, and it is an object of the present invention to provide an image display device which can obviate disconnections or the like in signal driving circuits.

A summary of typical aspects of the invention disclosed in this specification is as follows.

(1) An image display device according to the present invention is characterized, for example, by an image display panel, a first wiring printed circuit board which is arranged close to the image display panel, and a second wiring printed circuit board which is arranged so as to extend between the image display panel and the first wiring printed circuit board. The second wiring printed circuit board includes wiring for allowing the inputting of signals thereto from the first wiring printed circuit board side and the outputting of signals therefrom to the image display panel side, and the first wiring printed circuit board includes a portion which has a width that is smaller than the width of the first wiring printed circuit board at a side thereof opposite to the image display panel.

(2) An image display device according to the present invention is characterized, for example, by an image display panel, a first wiring printed circuit board which is arranged close to the image display panel, and a second wiring printed circuit board which is arranged so as to extend between the image display panel and the first wiring printed circuit board. The second wiring printed circuit board includes wiring for allowing the inputting of signals thereto from the first wiring printed circuit board side and the outputting of signals therefrom to the image display panel side, and the first wiring printed circuit board includes a notched portion at a side thereof opposite to the image display panel.

(3) An image display device according to the present invention is characterized, for example, by an image display panel, a first wiring printed circuit board which is arranged close to the image display panel, and a second wiring printed circuit board which is arranged so as to extend between the image display panel and the first wiring printed circuit board. The second wiring printed circuit board includes a wiring layer for allowing the inputting of signals thereto from the first wiring printed circuit board side and the outputting of signals therefrom to the image display panel side, and the first wiring printed circuit board includes a plurality of notched portions which extend from one side to another side at a side thereof opposite to the image display panel.

(4) An image display device according to the present invention is characterized, for example, by an image display panel, a first wiring printed circuit board which is arranged close to the image display panel, and a second wiring printed circuit board which is arranged so as to extend between the image display panel and the first wiring printed circuit board. The second wiring printed circuit board includes wiring for allowing the inputting of signals thereto from the first wiring printed circuit board side and the outputting of signals therefrom to the image display panel side, and the first wiring printed circuit board includes a recessed portion at a side thereof opposite to the image display panel.

(5) The image display device according to the present invention, for example, on the basis of any one of the above-mentioned constitutions (1) to (4), is characterized in that a semiconductor device which is connected to the wiring is mounted on the second wiring printed circuit board.

(6) The image display device according to the present invention, for example, on the basis of the constitution (2), is characterized in that the notched portion is formed in a region defined between the first wiring printed circuit board and the second wiring printed circuit board.

(7) The image display device according to the present invention, for example, on the basis of the constitution (4), is characterized in that the recessed portion is formed in a region defined between the first wiring printed circuit board and the second wiring printed circuit board.

(8) The image display device according to the present invention, for example, on the basis of any one of the above-mentioned constitutions (1) to (4), is characterized in that the image display panel includes gate signal lines which supply scanning signals to groups of pixels each consisting of respective pixels arranged in parallel in one direction and drain signal lines which supply video signals to respective pixels to which the scanning signals are supplied on a surface thereof, and the second wiring printed circuit board constitutes a scanning signal driving circuit which supplies the scanning signals to the gate signal lines.

(9) The image display device according to the present invention, for example, on the basis of any one of the above-mentioned constitutions (1) to (4), is characterized in that the image display panel includes gate signal lines which supply scanning signals to groups of pixels each consisting of respective pixels arranged in parallel in one direction and drain signal lines which supply video signals to respective pixels to which the scanning signals are supplied on a surface thereof, and the second wiring printed circuit board constitutes a video signal driving circuit which supplies the video signals to the drain signal lines.

(10) The image display device according to the present invention, for example, on the basis of any one of the above-mentioned constitutions (1) to (4), is characterized in that the image display panel includes gate signal lines which supply scanning signals to groups of pixels each consisting of respective pixels arranged in parallel in one direction and drain signal lines which supply video signals to respective pixels to which the scanning signals are supplied on a surface thereof; the second wiring printed circuit board includes a printed circuit board, which constitutes a scanning signal driving circuit for supplying the scanning signals to the gate signal lines and a printed circuit board which constitutes a video signal driving circuit for supplying video signals to the drain signal lines, and the first wiring printed circuit board, which is connected to the scanning signal driving circuit and the first wiring printed circuit board which is connected to the video signal driving circuit, are formed as separate printed circuit boards that are independent from each other.

(11) The image display device according to the present invention, for example, on the basis of the constitution (2), is characterized in that the notched portion is formed in at least either one of the first wiring printed circuit board, which is connected to the second wiring printed circuit board constituting the scanning signal driving circuit, and the first wiring printed circuit board, which is connected to the second wiring printed circuit board constituting the video signal driving circuit.

(12) The image display device according to the present invention, for example, on the basis of the constitution (4), is characterized in that the recessed portion is formed in at least either one of the first wiring printed circuit board which is connected to the second wiring printed circuit board constituting the scanning signal driving circuit, and the first wiring printed circuit board which is connected to the second wiring printed circuit board, constituting the video signal driving circuit.

(13) The image display device according to the present invention, for example, on the basis of any one of the above-mentioned constitutions (1) to (4), is characterized in that a dummy printed circuit board which connects the first wiring printed circuit board and the image display panel is provided to an end portion of the first wiring printed circuit board.

(14) The image display device according to the present invention, for example, on the basis of the constitution (2), is characterized in that the image display device includes a frame which is arranged such that the frame surrounds the image display panel, the first wiring printed circuit board and the second wiring printed circuit board, and a projection with which the notched portion is engaged is formed on the frame.

(15) The image display device according to the present invention, for example, on the basis of the constitution (4), is characterized in that the image display device includes a frame which is arranged such that the frame surrounds the image display panel, the first wiring printed circuit board and the second wiring printed circuit board, and a projection with which the recessed portion is engaged is formed on the frame.

(16) The image display device according to the present invention, for example, on the basis of the constitution (2), is characterized in that a connector or a flat cable which connects the first wiring printed circuit board and another printed circuit board is arranged in the notched portion.

(17) The image display device according to the present invention, for example, on the basis of the constitution (4), is characterized in that a connector or a flat cable which connects the first wiring printed circuit board and another printed circuit board is arranged in the recessed portion.

(18) The image display device according to the present invention, for example, on the basis of the constitution (2), is characterized in that a connector or a flat cable which connects the first wiring printed circuit board which supplies scanning signals and the first wiring printed circuit board which supplies the video signals is arranged in the notched portion.

(19) The image display device according to the present invention, for example, on the basis of the constitution (4), is characterized in that a connector or a flat cable which connects the first wiring printed circuit board which supplies scanning signals and the first wiring printed circuit board which supplies the video signals is arranged in the recessed portion.

However, the present invention is not limited to the above-mentioned constitutions and various modifications can be made without departing from the scope of the technical concept of the present invention.

DETAILED DESCRIPTION OF THE INVENTION

Hereinafter, various embodiments of a liquid crystal display device according to the present invention will be explained in conjunction with the drawings.

Embodiment 1

[Module of Liquid Crystal Display Device]

Figure 2:
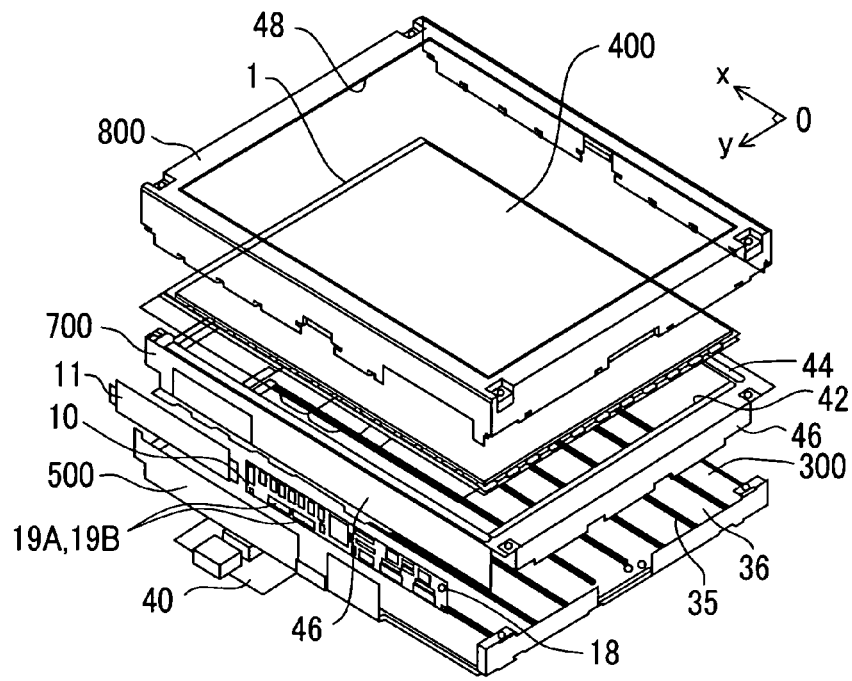
FIG. 2 is an exploded perspective view showing one embodiment of the image display device according to the present invention.

FIG. 2 is an exploded perspective view showing one embodiment of a module of a liquid crystal display device according to the present invention.

The liquid crystal display device shown in the drawing is roughly constituted of a liquid crystal display panel module 400, a backlight 300, a resin frame body 500, an intermediate frame 700, an upper frame 800 and the like, which are formed into a module.

Here, in this embodiment, a reflector which constitutes a portion of the backlight 300 is formed on a bottom surface of the resin frame body 500. Although the physical distinction between the resin frame body 500 and the backlight 300 is difficult, they can be functionally distinguished from each other in the above-mentioned manner.

Hereinafter, respective members which form the liquid crystal display device will be sequentially explained.

[Liquid Crystal Display Panel Module 400]

Figure 3A:
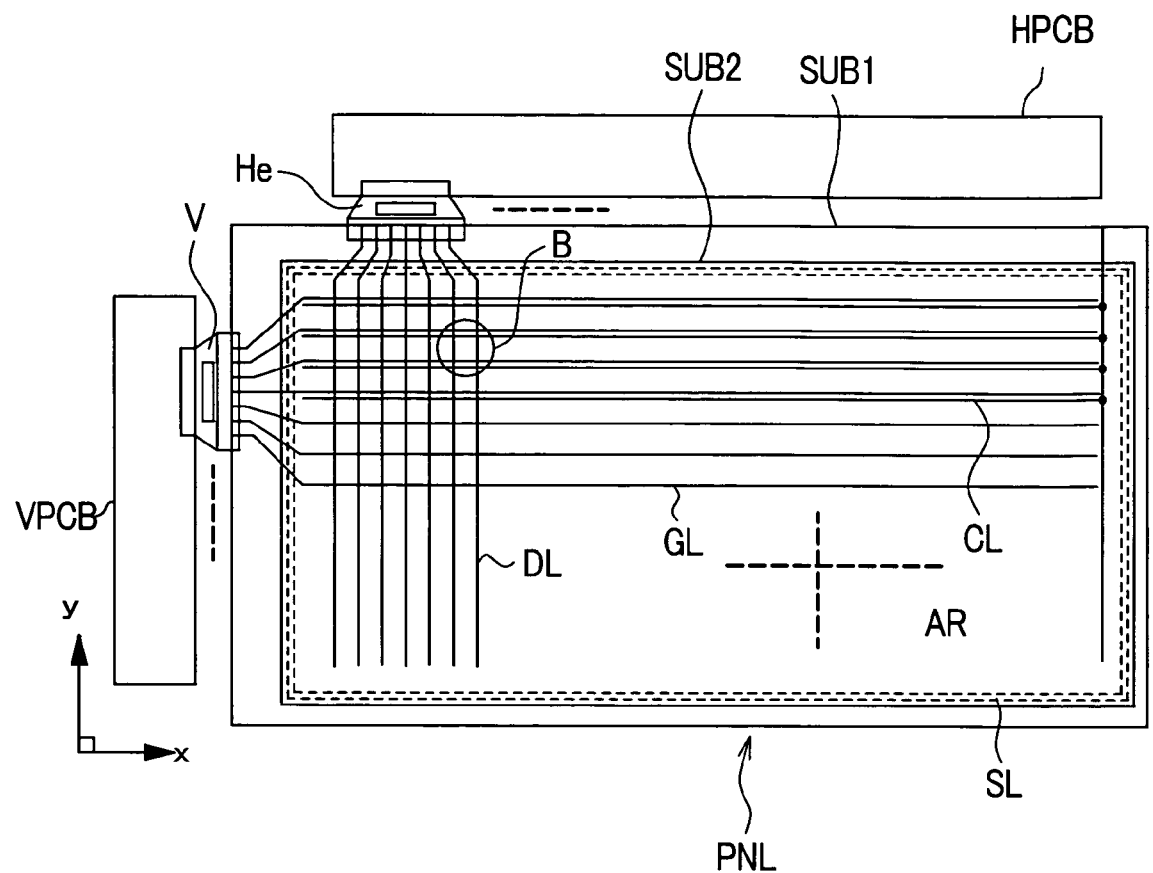
FIG. 3A is an equivalent circuit diagram showing one embodiment of a display panel module of an image display device according to the present invention; and, FIG. 3B is a circuit diagram of a representative pixel B in FIG. 3A.
Figure 3B:
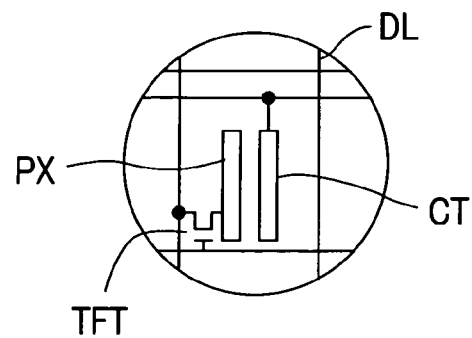

The liquid crystal display panel module 400, as shown in FIG. 3A, which depicts the equivalent circuit of the liquid crystal display panel module 400, includes a liquid crystal display panel PNL, a video signal driving printed circuit board HPCB, which is arranged close to one of the long sides of the liquid crystal panel PNL, and a scanning signal driving printed circuit board VPCB, which is arranged close to one of short sides of the liquid crystal panel PNL. Further, bridging the gap between the liquid crystal display panel PNL and the video signal driving printed circuit board HPCB, a plurality of video signal driving circuits He are provided, each of which is constituted of semiconductor devices formed by a so-called tape carrier method.

Here, with respect to the semiconductor device which is formed by the tape carrier method, a semiconductor circuit is mounted at substantially the center of a flexible printed circuit board, input bumps thereof are connected on one hand to a wiring layer formed on a surface of the flexible printed circuit board via terminals from one side of the flexible printed circuit board, and output bumps thereof are connected on the other hand to a wiring layer formed on a surface of the flexible printed circuit board via terminals from another side, which faces the above-mentioned one side of the flexible printed circuit board in an opposed manner.

In the same manner, bridging the gap between the liquid crystal display panel PNL and the scanning signal driving printed circuit board VPCB, a plurality of scanning signal driving circuits V are provided, each of which is constituted of semiconductor devices formed by a tape carrier method.

Signals from a control circuit (not shown in the drawing) are inputted to the video signal driving circuits He via the above-mentioned video signal driving printed circuit board HPCB and the video signals are supplied to the drain signal lines DL of the liquid crystal display panel PNL by the video signal driving circuits He. Further, other signals from the control circuit are inputted to the scanning signal driving circuits V via the above-mentioned scanning signal driving printed circuit board VPCB, and the video signals are supplied to the gate signal lines GL of the liquid crystal display panel PNL by the scanning signal driving circuit V.

The liquid crystal display panel PNL includes a pair of transparent substrates SUB1, SUB2 which are arranged to face each other in an opposed manner with liquid crystal material sandwiched therebetween, such that the liquid crystal material is filled in a space defined between the pair of transparent substrates SUB1, SUB2 and is sealed by a sealing member SL, which also serves for fixing the transparent substrate SUB2 to the transparent substrate SUB1.

On a liquid-crystal-side surface of the above-mentioned one transparent substrate SUB1, which is surrounded by the sealing member SL, there are gate signal lines GL, which extend in the x direction and are arranged in parallel in the y direction, and drain signal lines DL, which extend in the y direction and are arranged in parallel in the x direction. Regions which are surrounded by respective gate signal lines GL and respective drain signal lines DL constitute pixel regions, and a plurality of these pixel regions disposed in a matrix array constitute a liquid crystal display part AR.

Further, in respective pixel regions which are arranged in parallel in the x direction, a common counter voltage signal line CL runs within respective pixel regions. The counter voltage signal line CL constitutes a signal line which supplies a voltage, which becomes the reference with respect to the video signals, to counter electrodes CT of respective pixel regions, as will be described later.

In each pixel region, there are a thin film transistor TFT, which is operated in response to the scanning signal from the one-side gate signal line GL, and a pixel electrode PX to which the video signal is supplied from the one-side drain signal line DL via the thin film transistor TFT.

An electric field is generated between the pixel electrode PX and the counter electrode CT, which is connected to the above-mentioned counter voltage signal line CL, and the optical transmissivity of the liquid crystal is controlled in response to this electric field.

Respective ends of the gate signal lines GL extend over the sealing material SL and the ends constitute terminals to which output terminals of the scanning signal driving circuit V are connected. Further, to input terminals of the above-mentioned scanning signal driving circuits V, signals from the above-mentioned scanning signal driving printed circuit board VPCB, which is arranged outside the liquid crystal display panel PNL, are inputted. The scanning signal driving circuit V is constituted of a plurality of semiconductor devices, wherein a plurality of gate signal lines GL which are arranged close to each other are formed into a group, and one semiconductor device is allocated to each group.

In the same manner, respective ends of the drain signal lines DL extend over the sealing material SL and the ends constitute terminals to which output terminals of the video signal driving circuit He are connected. Further, to input terminals of the above-mentioned video signal driving circuit He, signals from the above-mentioned video signal driving printed circuit board HPCB, which is arranged outside the liquid crystal display panel PNL, are inputted.

The video signal driving circuit He is also constituted of a plurality of semiconductor devices, wherein a plurality of drain signal lines DL which are arranged close to each other are formed into a group, and one semiconductor device is allocated to each group.

Further, the above-mentioned counter voltage signal lines CL are, for example, connected in common at a right-side end portion, as seen in the drawing, a connection line extends over the sealing material SL, and the end thereof constitutes a terminal. From this terminal, a voltage is supplied which becomes the reference with respect to the video signal.

Respective gate signal lines GL are sequentially selected one after another in response to scanning signals from the scanning signal driving circuit V. On the other hand, to respective drain signal lines DL, video signals are supplied by the video signal driving circuit He at the timing of selection of the gate signal lines GL.

Figure 1:
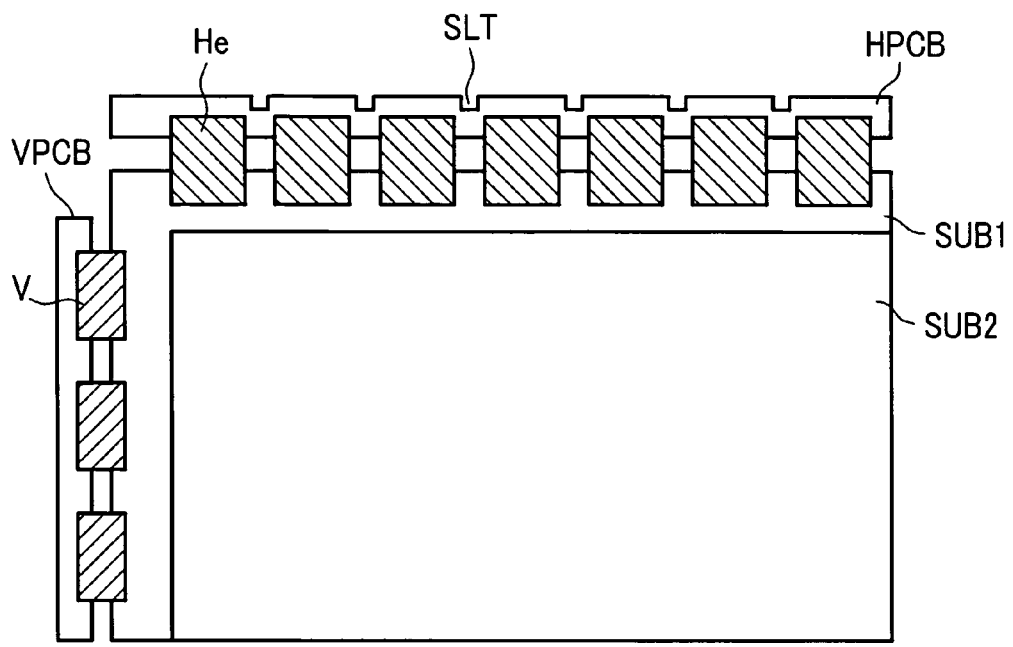
FIG. 1 is a plan view showing one embodiment of a display panel module of an image display device according to the present invention.

Here, with respect to this embodiment, as shown in FIG. 1, which is a simplified view of FIG. 3A and indicates a plurality of video signal driving circuits He and scanning signal driving circuits V, for example, slits SLT are formed in the video signal driving printed circuit board HPCB at a side opposite to the liquid crystal display panel PNL. These slits SLT are formed, for example, along the side of the back HPCB between respective video signal driving circuits He and the slit formed portion has a width slightly smaller than the width of the other portion of the video signal driving printed circuit board HPCB.

In the liquid crystal display panel module 400 having such a constitution, it is possible to obtain the advantageous effect that the probability of the occurrence of disconnection can be largely reduced. That is, for example, when the video signal driving printed circuit board HPCB thermally expands with respect to the liquid crystal display panel PNL due to a change in temperature, for example, stress which is generated due to thermal expansion is applied to wiring on the flexible printed circuit board of the video signal driving circuit He or to a connection portion with a semiconductor circuit mounted on the flexible printed circuit board, and there is the probability that a disconnection will occur. However, the liquid crystal display panel module 400 having the above-mentioned constitution can largely reduce the probability that this will occur.

That is, the following phenomenon has been discovered. Strain applied to the video signal driving printed circuit board HPCB, which is generated by the difference in thermal expansion coefficient between the liquid crystal display panel PNL and the video signal driving printed circuit board HPCB, not only acts as a simple force in a linear direction, but also involves stress which warps the respective video signal driving circuits He three-dimensionally. Particularly, the stress is largely generated with respect to the video signal driving circuits He, which are positioned at both sides of the gap among respective video signal driving circuits He which are arranged in parallel, and the stress is concentrated on the side opposite to the liquid crystal display panel PNL.

In view of the above, in the case of the above-mentioned embodiment, by forming the slits SLT in parallel on the side of the video signal driving printed circuit board HPCB opposite to the side facing the liquid crystal display panel PNL, it is possible to scatter the strain which is generated due to the difference in thermal expansion coefficient, thus preventing the concentration of strain in the video signal driving circuits He.

Based on the above-mentioned understanding, it is not always necessary to form the slits SLT only in the region between respective video signal driving circuits He, since the strain concentration can be eliminated even when the number of slits SLT is reduced or increased.

Figure 12:
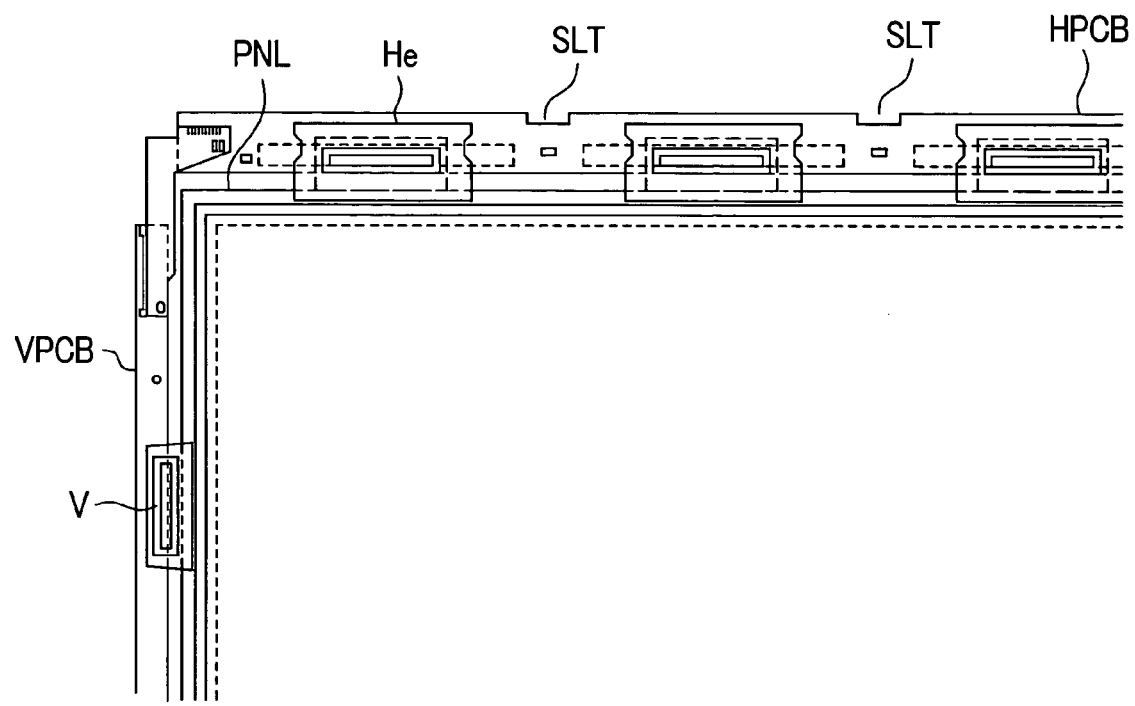
FIG. 12 is a plan view showing one embodiment of a liquid crystal display panel which is actually designed in an image display device according to the present invention.

FIG. 12 is a plan view of an actually designed liquid crystal display panel PNL, which and shows a left upper corner portion of the liquid crystal display panel PNL in FIG. 1. A plurality of slits SLT, which are arranged in parallel in the longitudinal direction of the video signal driving printed circuit board HPCB, are formed on the side of the video signal driving printed circuit board HPCB opposite to the side facing the liquid crystal display panel PNL.

[Backlight 300]

On a back surface of the liquid crystal display panel module 400, a backlight 300 is arranged. This backlight 300 is of a so-called direct type and is constituted of a plurality of (eight in the drawing) linear light sources 35, which extend in the x direction in the drawing and are arranged in parallel in the y direction in the drawing at an equal interval, and a reflector 36 which reflects light emitted from the light source 35 to the liquid crystal display panel module 400 side.

The reflector 36 is formed so as to have a corrugated shape in the parallel direction (y direction) of the light sources 35. That is, the reflector 36 is formed to have a shape which makes the reflector 36 efficiently reflect all of the light emitted from respective light sources 35 toward the liquid crystal display panel module side.

These light sources 35 are respectively formed of, for example, a so-called cold cathode ray tube. The cathode ray tube is turned on by applying a voltage to electrodes formed in both ends thereof. Further, it is needless to say that a hot cathode fluorescent lamp, a xenon lamp, a vacuum fluorescent display lamp and the like can be used as the light sources 35.

[Resin Frame Body 500]

The resin frame body 500 constitutes a portion of an outer frame of the liquid crystal display device which is formed into a module and houses the backlight 300. Here, the resin frame body 500 is formed into a box shape having a bottom surface and side surfaces. Upper end faces of the side surfaces are configured to allow mounting of a diffusion plate (not shown in the drawing) which is arranged to cover the backlight 300.

The diffusion plate has a function of diffusing light emitted from respective light sources 35 of the backlight 300, and, hence, it is possible to radiate uniform light without irregularities in brightness to the liquid crystal display panel module 400 side. In this case, the resin frame body 500 is formed with a relatively small wall thickness. This is because the decrease of the mechanical strength due to the small wall thickness can be compensated by the reinforcement obtained by using the middle frame 700 to be described later.

[Middle Frame 700]

The middle frame 700 is arranged between the liquid crystal display panel module 400 and the diffusion plate (not shown in the drawing). The middle frame 700 is constituted of a metal plate having a relatively small wall thickness, wherein an opening 42 is formed in a portion thereof which corresponds to a display region portion of the liquid crystal display panel module 400.

The middle frame 700 has a function of pushing the diffusion plate to the resin frame body 500 and a function of supporting the liquid crystal display panel module 400 thereon. Accordingly, spacers 44 for positioning the liquid crystal display panel 1 are mounted on portions of an upper surface of the middle frame 700 on which the liquid crystal display panel module 400 is placed. Due to such a constitution, the liquid crystal display panel 1 can be accurately positioned with respect to the middle frame 700.

Further, the middle frame 700 is configured such that side surfaces 46 are integrally formed thereto. That is, the middle frame 700 is configured such that the above-mentioned opening 42 is formed in the bottom surface of the metal plate having a substantially box shape.

The middle frame 700 having such a shape is fitted in the resin frame body 500 in a state such that the diffusion plate is interposed between the middle frame 700 and the resin frame body 500. That is, the middle frame 700 is mounted such that the middle frame 700 has the inner walls of the side surfaces 46 thereof face the outer walls of the side surfaces of the resin frame body 500 in an opposed manner.

The middle frame 700, which is formed of the metal plate and has such a constitution, constitutes one frame (a casing) together with the resin frame body 500, and, hence, it is possible to enhance the mechanical strength of the resin frame body 500 without increasing the wall thickness of the resin frame body 500.

That is, even when the middle frame 700 and the resin frame body 500 do not possess sufficient mechanical strength individually, by bringing them into a fitting engagement in the above-mentioned manner, the mechanical strength as a whole can be enhanced. Particularly, the combined structure exhibits sufficient strength against twisting of the box body about a diagonal line.

[Upper Frame 800]

The upper frame 800 has a function of pushing the liquid crystal display panel module 400, the middle frame 700 and the diffusion plate to the resin frame body 500, and, at the same time, it constitutes an outer frame of the module of the liquid crystal display device together with the resin frame body 500.

The upper frame 800 is formed of an approximately box-shaped metal plate, wherein an opening (a display window) 48 is formed in a portion of the metal plate corresponding to the liquid crystal display part AR of the liquid crystal display panel module 400. The upper frame 800 is mounted on the resin frame body 500 by engagement, for example.

Embodiment 2

Figure 4:
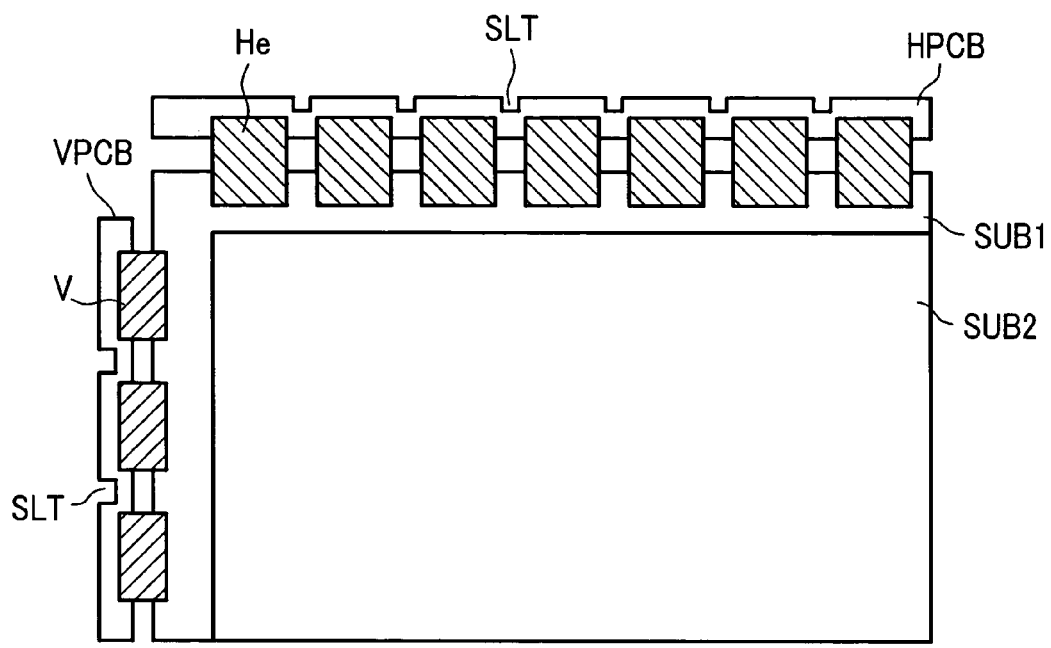
FIG. 4 is a plan view showing one embodiment of a display panel module of an image display device according to the present invention.

FIG. 4 is a plan view showing another embodiment of the liquid crystal display device according to the present invention, which generally corresponds to that of FIG. 1.

The feature which makes this embodiment different from the embodiment 1 shown in FIG. 1 lies in the fact that slits SLT similar to the slits formed in the above-mentioned video signal driving printed circuit board HPCB are also formed in the scanning signal driving printed circuit board VPCB.

Since stress and strain generated on the video signal driving printed circuit board of this kind is increased in proportion to the length thereof, it is more effective to mount the slits SLT in the video signal driving printed circuit board HPCB than in the scanning signal driving printed circuit board VPCB. However, due to the recent trend toward increasing the size of the liquid crystal display panel PNL, the length of the scanning signal driving printed circuit board VPCB is also elongated, and, hence, it is needless to say that the slits also may be formed in the scanning signal driving printed circuit board VPCB.

Embodiment 3

Figure 5A:
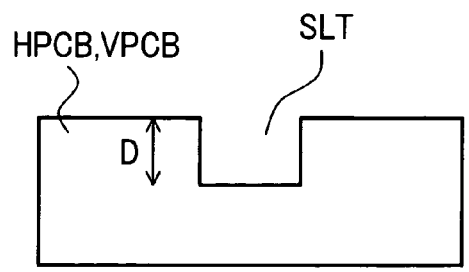
FIGS. 5A and 5B are diagrams showing examples of a slit formed in a signal driving printed circuit board of an image display device according to the present invention.
Figure 5B:
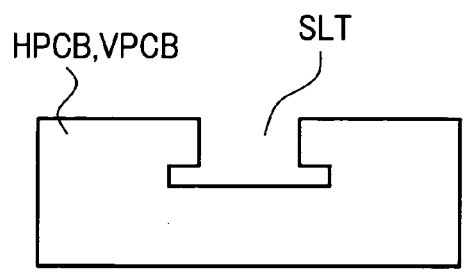

FIGS. 5A and 5B are diagrams showing examples of the shape of the slits formed in the video signal driving printed circuit board HPCB or in the scanning signal driving printed circuit board VPCB.

First of all, in FIG. 5A, the notch formed on the signal driving printed circuit board has a rectangular shape and the depth thereof is not less than 1 mm and not more than 5 mm. The reason for setting the depth of the notch to not less than 1 mm is that the desired stress relaxation is not obtained when the depth of the notch is less than 1 mm. Further, the reason for setting the depth of the notch to not more than 5 mm is that, when the depth of the notch exceeds 5 mm, the width of the signal driving printed circuit board becomes excessively narrow at the slit SLT portion, and, hence, a so-called torsional stress is easily generated at the signal driving printed circuit board, whereby the stress applied to the signal driving circuit is increased to the contrary.

Further, in FIG. 5B, the notch has a "T" shape in which slight notches are further formed in the center side of the driving signal printed circuit board such that the slight notches extend along the longitudinal direction of the signal driving printed circuit board. In this case, from the viewpoint of transmission of stress, these slightly notched portions constitute plays, and, hence, the stress relaxation effect is increased.

Here, the shape of slit SLT formed on each signal driving printed circuit board is not particularly limited. In short, when the width of the portion of the driving signal printed circuit board where the slit SLT is formed is set to be smaller than the width of the other portions of the driving signal printed circuit board, the advantageous effect of the present invention can be sufficiently obtained. Further, the same goes for the slits SLT which will be described in respective embodiments hereinafter.

Embodiment 4

Figure 6:
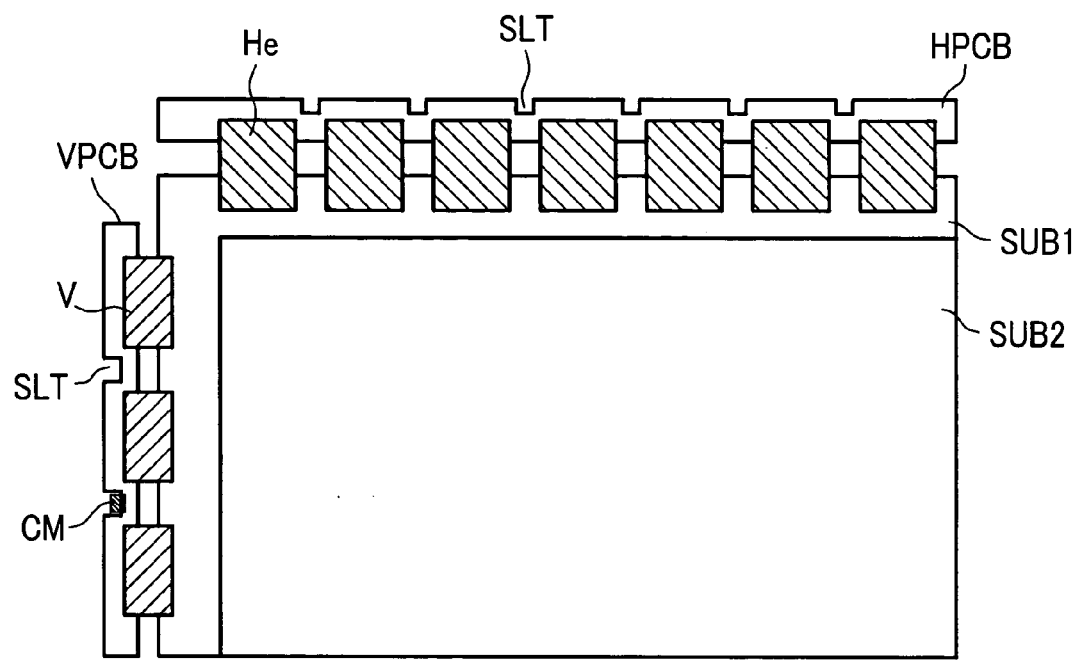
FIG. 6 is a plan view showing another embodiment of a display panel module of an image display device according to the present invention.

FIG. 6 is a plan view showing another embodiment of the image display device according to the present invention, which generally corresponds to that of FIG. 4.

The feature which makes this embodiment different from the embodiment shown in FIG. 4 lies in the fact that, in at least one of the respective slits SLT which are formed in the scanning signal driving printed circuit board VPCB, connecting means CM, such as connectors or flat cables, for example, are arranged and these slits SLT are used as paths for pulling out the wiring on a back surface side of the scanning signal driving printed circuit board VPCB to a front surface side of the scanning signal driving printed circuit board VPCB.

This provision is made to reduce the size of the so-called picture frame using a so-called extra space effectively. Here, the picture frame is a region which is sandwiched between an outer frame of the liquid crystal display part AR of the liquid crystal display panel PNL and an outer frame of the liquid crystal display module 400.

Embodiment 5

Figure 7:
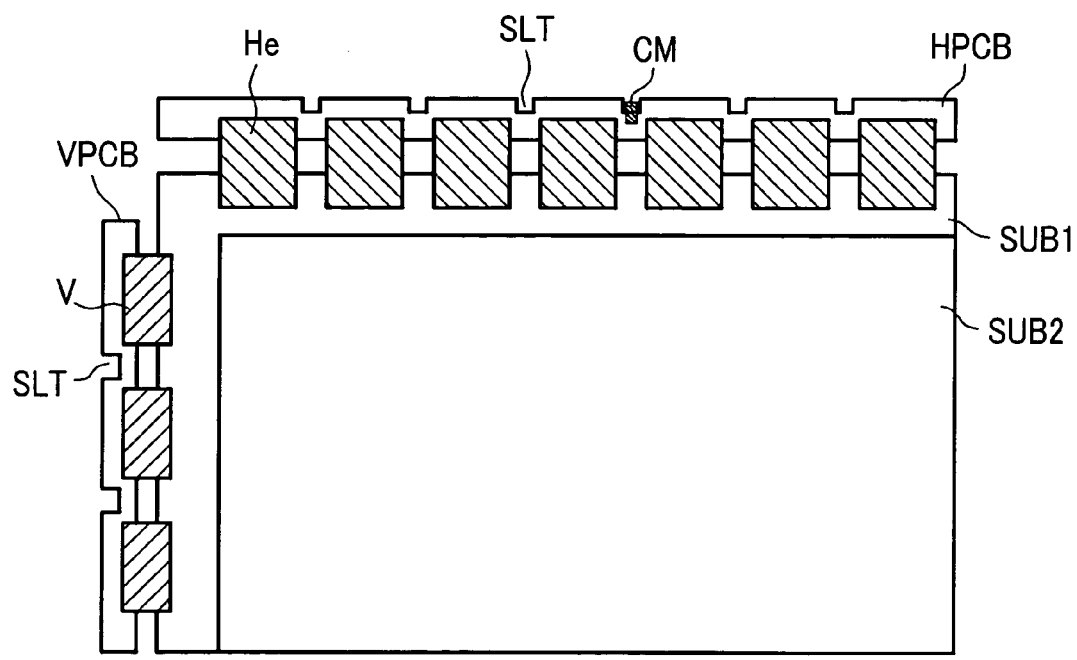
FIG. 7 is a plan view showing another embodiment of a display panel module of an image display device according to the present invention.

FIG. 7 is a plan view showing another embodiment of the image display device according to the present invention, which generally corresponds to that of FIG. 6.

The feature which makes this embodiment different from the embodiment shown in FIG. 6 lies in the fact that the connecting means CM, such as the connectors or the flat cables, for example, are not provided to the slits SLT formed in the scanning signal driving printed circuit board VPCB, but are provided to at least one of the slits SLT formed in the video signal driving printed circuit board HPCB.

Even with such a constitution, the embodiment can exhibit advantageous effects similar to those obtained by the embodiment shown in FIG. 6. Further, it is needless to say that the connecting means CM may be arranged not only at the scanning signal driving printed circuit board VPCB side, but also at the video signal driving printed circuit board HPCB in combination.

Embodiment 6

Figure 8:
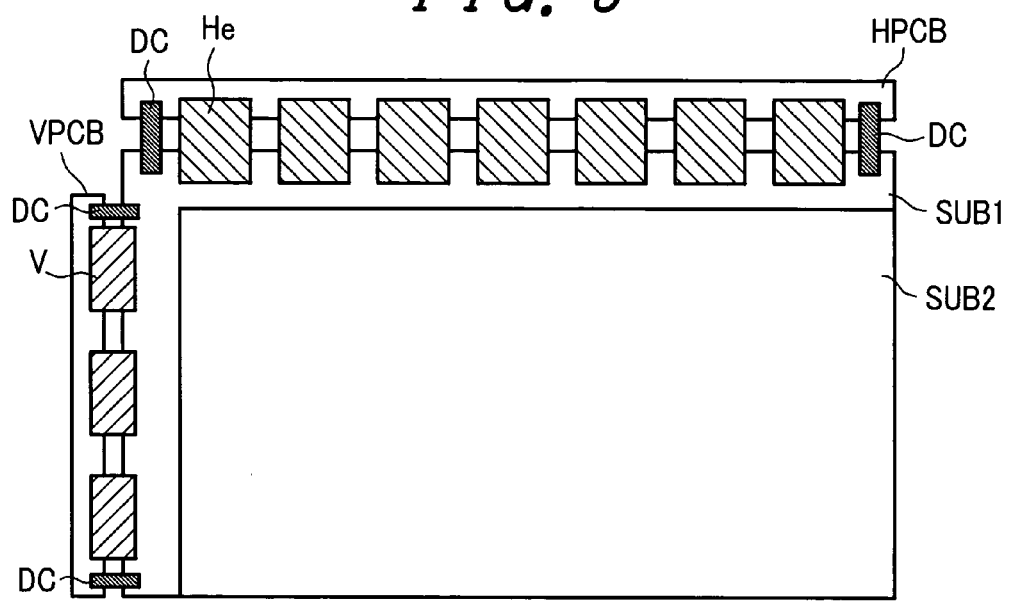
FIG. 8 is a plan view showing another embodiment of a display panel module of an image display device according to the present invention.

FIG. 8 is a plan view showing another embodiment of the image display device according to the present invention. In FIG. 8, unlike FIG. 1, the slits SLT are formed in neither the video signal driving printed circuit board HPCB nor the scanning signal driving printed circuit board VPCB.

As an alternative to the slits SLT, in this embodiment, dummy wiring printed circuit boards DC are formed at both sides of the video signal driving printed circuit board HPCB, such that the dummy wiring printed circuit boards DC bridge the video signal driving printed circuit board HPCB and the liquid crystal display panel PNL. Further, in FIG. 8, dummy wiring printed circuit boards DC are also formed at both sides of the scanning signal driving printed circuit board VPCB, such that the dummy wiring printed circuit boards DC bridge the scanning signal driving printed circuit board HPCB and the liquid crystal display panel PNL.

These dummy wiring printed circuit boards DC may be constituted of, for example, the video signal driving circuit He or the scanning signal driving circuit V, provided that the dummy wiring printed circuit boards DC are made of a material having flexibility in the same manner as the flexible printed circuit board of these circuits. In view of the above, although it is not always necessary that a wiring layer is formed on the surface of the dummy wiring printed circuit board DC, it is preferable to form the wiring layer on the surface of the dummy wiring printed circuit board DC in view of the connection between the signal driving printed circuit board and the liquid crystal display panel PNL.

Further, when the wiring is formed on the dummy wiring printed circuit board DC, it is possible to achieve the additional advantageous effect that signals, such as common potential signals or power source potential signals, can be transmitted from the signal driving printed circuit board to the liquid crystal display panel PNL by making use of the above-mentioned wiring.

As mentioned above, the influence of the strain caused by the thermal expansion of the signal driving printed circuit board with respect to the liquid crystal display panel PNL is largely generated at the signal driving circuits which are positioned at both sides of the signal driving printed circuit board among the respective signal driving circuits which are arranged parallel to each other. This embodiment is provided for causing an influence to be exerted on the dummy printed wiring boards DC such that the influence is not transmitted to the signal driving circuits which are arranged inside the dummy printed wiring boards DC.

Embodiment 7

Figure 9:
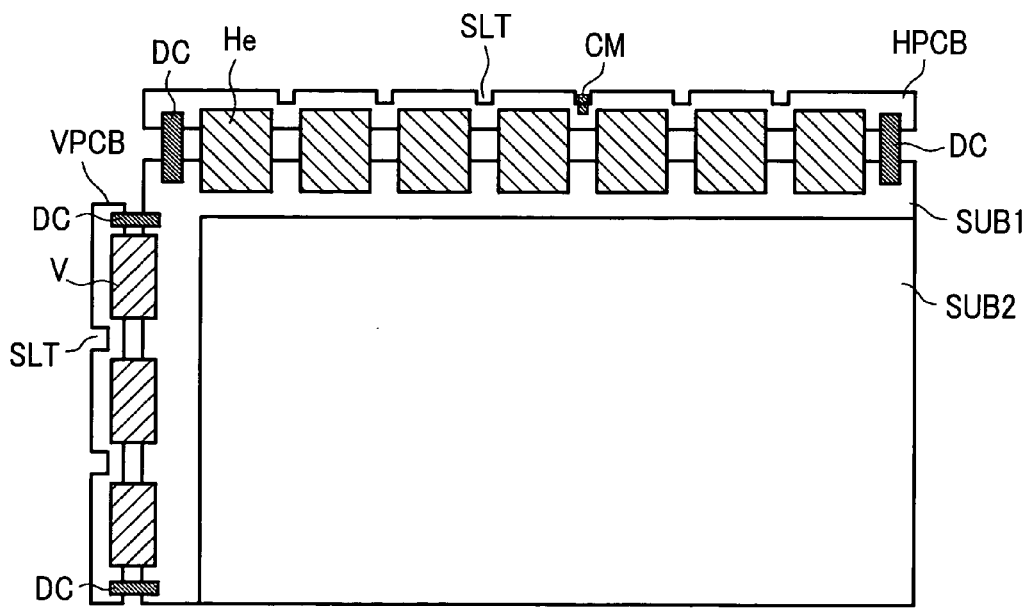
FIG. 9 is a plan view showing another embodiment of a display panel module of an image display device according to the present invention.

FIG. 9 is a plan view showing another embodiment of the image display device according to the present invention, which generally and corresponds to that of FIG. 8.

The feature which makes this embodiment different from the embodiment shown in FIG. 8 lies in the fact that, although this embodiment is provided with the above-mentioned dummy wiring printed circuit boards DC, the embodiment is further provided with slits SLT formed on respective signal driving printed circuit boards.

This provision is made to further enhance the above-mentioned advantageous effects for further assuring the reliability of operations. Here, in this case, it is needless to say that, for example, the dummy wiring printed circuit boards DC may be provided to the video signal driving printed circuit board HPCB side and the slits SLT are formed in the scanning signal driving printed circuit board VPCB side.

Embodiment 8

Figure 10A:
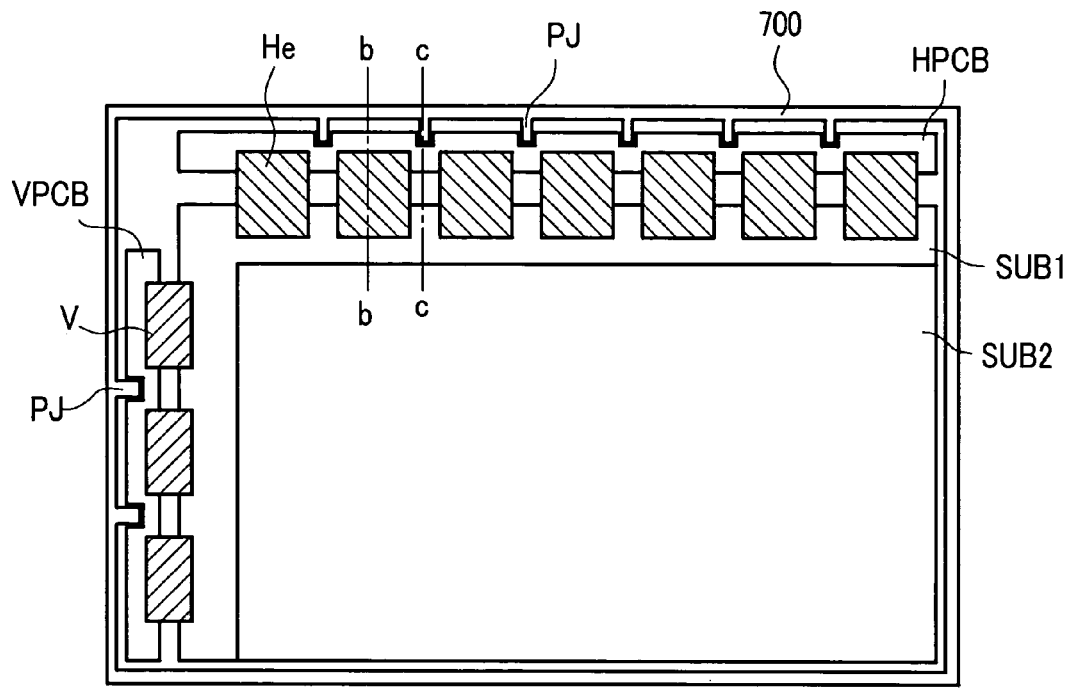
FIG. 10A is a plan view.
Figure 10B:
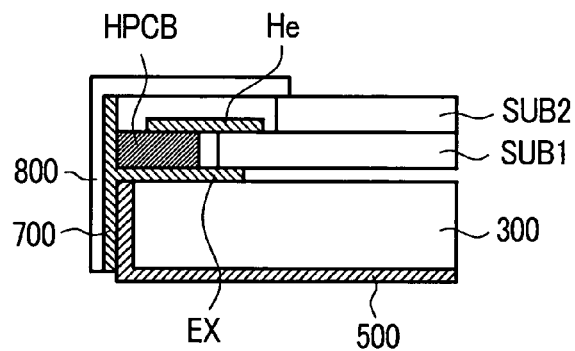
FIGS. 10B and 10C are sectional views taken along lines b-b and c-c, respectively, in FIG. 10A, showing another embodiment of an image display device according to the present invention.
Figure 10C:
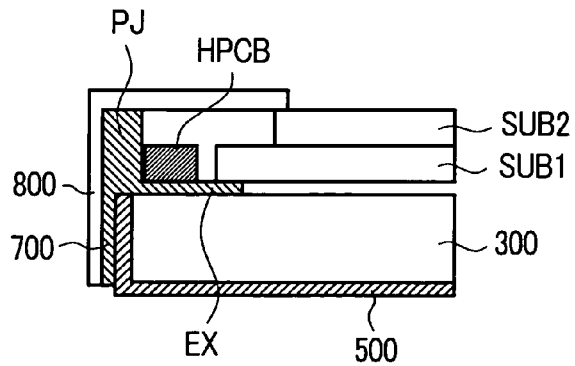

FIG. 10A is a plan view showing another embodiment of the image display device according to the present invention, which generally corresponds to that of FIG. 2. Further, FIG. 10B is a cross-sectional view taken along a line b-b in FIG. 10A and FIG. 10C is a cross-sectional view taken along a line c-c in FIG. 10A.

The feature which makes this embodiment different from the embodiment shown in FIG. 2 lies in the fact that, firstly, the liquid crystal display panel module 400 is shown in relation to the middle frame 700.

Here, projection portions PJ are integrally formed, for example, on the inside of the middle frame 700 and these projection portions PJ are configured to engage with or fit into respective slits SLT formed in the video signal driving printed circuit board HPCB and respective slits SLT formed in the scanning signal driving printed circuit board VPCB.

That is, on the inner surface of the middle frame 700, an extension portion EX, for mounting the liquid crystal display panel PNL, the video signal driving printed circuit board HPCB and the scanning signal driving printed circuit board VPCB, is formed such that the extension portion EX does not cover the liquid crystal display portion AR of the liquid crystal display panel PNL. Further, the above-mentioned projection portions PJ are formed in a state such that the projection portions PJ are erected from the extension portion EX in a direction perpendicular to the extension portion EX, and the projection portion PJ is connected to the inner surface of the extension portion EX.

By arranging the video signal driving printed circuit board HPCB and the scanning signal driving printed circuit board VPCB such that the above-mentioned projection portions PJ are engaged with or fitted into the slits SLT formed in these printed circuit boards, this embodiment can perform a function of suppressing the strain of the video signal driving printed circuit board HPCB and the scanning signal driving printed circuit board VPCB.

That is, in each of the video signal driving printed circuit board HPCB and the scanning signal driving printed circuit board VPCB, even when the side in which the slits SLT are formed expands between one slit SLT and a neighboring slit SLT in proportion to the length between the slits SLT, the expansion is suppressed by the interference of each slit SLT and the projection portion PJ which is engaged with or fitted into the slit SLT.

Further, by adopting such a constitution, it is possible to obtain advantageous effects in that the deformation of the middle frame 700 caused by twisting of the middle frame 700 per se can be reduced (the rigidity being strengthened), the contact area of the middle frame 700 with the upper frame 800 can be increased by an amount corresponding to the formation of the above-mentioned projection portions PJ, and the deformation of the upper frame 800 can be prevented. Eventually, the rigidity of the whole liquid crystal display module can be strengthened, and, hence, the disconnection of the wiring caused by strain of the module can be suppressed.

Embodiment 9

Figure 11A:
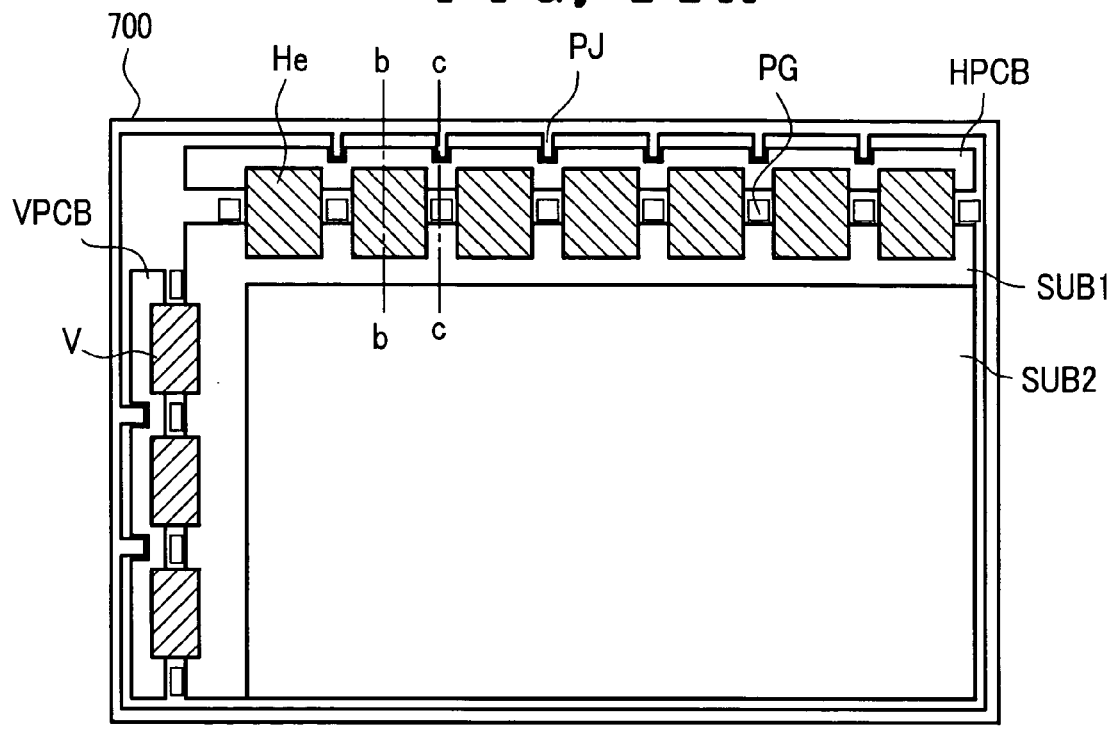
FIG. 11A is a plan view.
Figure 11B:
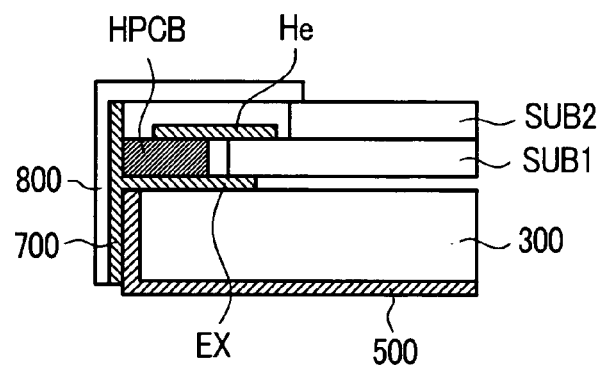
FIGS. 11B and 11C are sectional views taken along lines b-b and c-c, respectively, in FIG. 11A, showing another embodiment of an image display device according to the present invention.
Figure 11C:
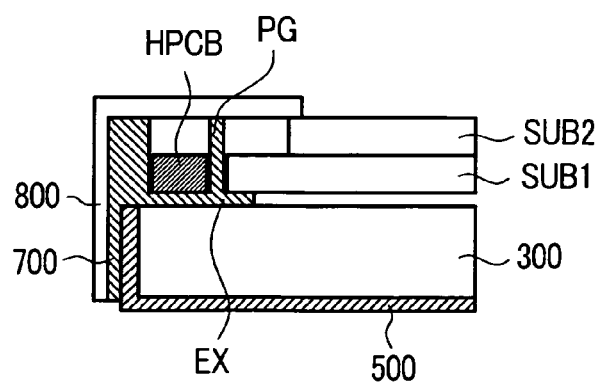

FIGS. 11A to 11C show another embodiment of the image display device according to the present invention similar to that FIG. 10A.

The feature which makes this embodiment different from the embodiment shown in FIG. 10A lies in the fact that, on the above-mentioned extension portion EX of the middle frame 700, projection portions PG are formed so as to project in the vertical direction with respect to the extension portion EX.

These projection portions PG are formed between the liquid crystal display panel PNL and the video signal driving printed circuit board HPCB and, at the same time, between one video signal driving circuit He that is and another video signal driving circuit He close to one video signal driving circuit He. The projection portions PG are also formed between the liquid crystal display panel PNL and the scanning signal driving printed circuit board VPCB and, at the same time, between one scanning signal driving circuit V and another scanning signal driving circuit V that is close to one scanning signal driving circuit V. The projection portions PG have a height such that an upper surface thereof becomes coplanar with an upper surface of the middle frame 700.

Due to such a constitution, in addition to the advantageous effects obtained by the provision shown in FIG. 10, the above-mentioned projection portions PG also have a function of supporting the upper frame 800, and, hence, the rigidity of the upper frame 800 per se can be strengthened. Further, through contact between the upper frame 800 with the above-mentioned projection portions PG, it is possible to obtain an advantageous effect in that the resonance frequency of the upper frame 800 can be dispersed, and, hence, the disconnection of the wiring at the connection portion thereof caused by vibration can be suppressed.

The above-mentioned respective embodiments may be used independently or in combination. This is because the advantageous effects of the respective embodiments can be obtained independently or synergistically.

Further, although the present invention has been described in conjunction with a liquid crystal display device, it is needless to say that the present invention is applicable to other image display devices, including an organic EL display device, for example. This is because other image display devices have substantially the same constitution except for the display panel.

As can be clearly understood from the foregoing, according to the image display device of the present invention, disconnection or the like at the signal driving circuits can be obviated.

The invention claimed is:

1. An image display device which includes an image display panel, a first wiring printed circuit board which is arranged close to the image display panel, and a second wiring printed circuit board which is arranged to bridge between the image display panel and the first wiring printed circuit board, wherein the second wiring printed circuit board includes a wiring layer for allowing an inputting of signals thereto from the first wiring printed circuit board side and an outputting of signals therefrom to the image display panel side, and the first wiring printed circuit board includes a plurality of notched portions which are spaced along one side thereof which is opposite to the side facing the image display panel, and wherein a frame is provided which is adapted to substantially surround the image display panel, the first wiring printed circuit board and the second wiring printed circuit board and is adapted to support at least portions of the image display panel and the first wiring printed circuit board.

2. An image display device according to claim 1, wherein the frame has projection portions which are fitted to the notched portions of the first wiring printed circuit board.

3. An image display device which includes an image display panel, a first wiring printed circuit board which is arranged close to the image display panel, and a second wiring printed circuit board which is arranged to bridge between the image display panel and the first wiring printed circuit board, wherein the second wiring printed circuit board includes wiring for allowing an inputting of signals thereto from the first wiring printed circuit board side and an outputting of signals therefrom to the image display panel side, and the first wiring printed circuit board includes a portion which has a width smaller than the width of the first wiring printed circuit board, disposed at a side thereof opposite to the side facing the image display panel, and wherein a frame is provided which is adapted to substantially surround the image display panel, the first wiring printed circuit board and the second wiring printed circuit board, and the frame is adapted to support at least portions of the image display panel and the first wiring printed circuit board.

4. An image display device according to claim 3, wherein a semiconductor device, which is connected to said wiring, is mounted on the second wiring printed circuit board.

5. An image display device according to claim 3, wherein the image display panel includes gate signal lines which supply scanning signals to groups of pixels, each consisting of respective pixels arranged in parallel in one direction, and drain signal lines which supply video signals to respective pixels to which the scanning signals are supplied on a surface thereof, and the second wiring printed circuit board constitutes a scanning signal driving circuit which supplies the scanning signals to the gate signal lines.

6. An image display device according to claim 3, wherein the image display panel includes gate signal lines which supply scanning signals to groups of pixels, each consisting of respective pixels arranged in parallel in one direction, and drain signal lines which supply video signals to respective pixels to which the scanning signals are supplied on a surface thereof, and the second wiring printed circuit board constitutes a video signal driving circuit which supplies the video signals to the drain signal lines.

7. An image display device according to claim 3, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, the second wiring printed circuit board includes a printed circuit board which constitutes a scanning signal driving circuit for supplying the scanning signals to the gate signal lines and a printed circuit board which constitutes a video signal driving circuit for supplying video signals to the drain signal lines, and the first wiring printed circuit board, which is connected to the scanning signal driving circuit, and the first wiring printed circuit board, which is connected to the video signal driving circuit, are formed as separate printed circuit boards that are independent from each other.

8. An image display device according to claim 3, wherein a dummy printed circuit board, which connects the first wiring printed circuit board and the image display panel, is provided at an end portion of the first wiring printed circuit board.

9. An image display device according to claim 3, wherein the frame has a projection portion which is fitted to the portion of the first wiring printed circuit board.

10. An image display device which includes an image display panel, a first wiring printed circuit board which is arranged close to the image display panel, and a second wiring printed circuit board which is arranged to bridge between the image display panel and the first wiring printed circuit board, wherein the second wiring printed circuit board includes wiring for allowing an inputting of signals thereto from the first wiring printed circuit board side and an outputting of signals therefrom to the image display panel side, and the first wiring printed circuit board includes a notched portion at a side thereof opposite to the side facing the image display panel, and wherein a frame is provided which is adapted to substantially surround the image display panel, the first wiring printed circuit board and the second wiring printed circuit board, and the frame is adapted to support at least portions of the image display panel and the first wiring printed circuit board.

11. An image display device according to claim 10, wherein the notched portion is formed in a region defined between the first wiring printed circuit board and the second wiring printed circuit board.

12. An image display device according to claim 10, wherein the notched portion is formed in at least either one of the first wiring printed circuit board, which is connected to the second wiring printed circuit board constituting the scanning signal driving circuit, and the first wiring printed circuit board, which is connected to the second wiring printed circuit board constituting the video signal driving circuit.

13. An image display device according to claim 10, wherein a connector or a flat cable which connects the first wiring printed circuit board and another printed circuit board is arranged in the notched portion.

14. An image display device according to claim 10, wherein a connector or a flat cable which connects the first wiring printed circuit board which supplies scanning signals and the first wiring printed circuit board which supplies the video signals is arranged in the notched portion.

15. An image display device according to claim 10, wherein a semiconductor device which is connected to the wiring is mounted on the second wiring printed circuit board.

16. An image display device according to claim 10, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, and the second wiring printed circuit board constitutes a scanning signal driving circuit which supplies the scanning signals to the gate signal lines.

17. An image display device according to claim 10, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, and the second wiring printed circuit board constitutes a video signal driving circuit which supplies the video signals to the drain signal lines.

18. An image display device according to claim 10, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, the second wiring printed circuit board includes a printed circuit board which constitutes a scanning signal driving circuit for supplying the scanning signals to the gate signal lines and a printed circuit board which constitutes a video signal driving circuit for supplying video signals to the drain signal lines, and the first wiring printed circuit board, which is connected to the scanning signal driving circuit, and the first wiring printed circuit board, which is connected to the video signal driving circuit, are formed as separate printed circuit boards that are independent from each other.

19. An image display device according to claim 10, wherein a dummy printed circuit board, which connects the first wiring printed circuit board and the image display panel, is provided at an end portion of the first wiring printed circuit board.

20. An image display device according to claim 10, wherein the frame has a projection portion which is fitted to the notched portion of the first wiring printed circuit board.

21. An image display device which includes an image display panel, a first wiring printed circuit board which is arranged close to the image display panel, and a second wiring printed circuit board which is arranged to bridge between the image display panel and the first wiring printed circuit board, wherein the second wiring printed circuit board includes wiring for allowing an inputting of signals thereto from the first wiring printed circuit board side and an outputting of signals therefrom to the image display panel side, and the first wiring printed circuit board includes a recessed portion at a side thereof opposite to the side facing the image display panel; and wherein a frame is provided which is adapted to substantially surround the image display panel, the first wiring printed circuit board and the second wiring printed circuit board, and is adapted to support at least portions of the image display panel and the first wiring printed circuit board.

22. An image display device according to claim 21, wherein the recessed portion is formed in a region defined between the first wiring printed circuit board and the second wiring printed circuit board.

23. An image display device according to claim 21, wherein the recessed portion is formed in at least either one of the first wiring printed circuit board, which is connected to the second wiring printed circuit board constituting the scanning signal driving circuit, and the first wiring printed circuit board, which is connected to the second wiring printed circuit board constituting the video signal driving circuit.

24. An image display device according to claim 21, wherein a connector or a flat cable which connects the first wiring printed circuit board and another printed circuit board is arranged in the recessed portion.

25. An image display device according to claim 21, wherein a connector or a flat cable which connects the first wiring printed circuit board which supplies scanning signals and the first wiring printed circuit board which supplies the video signals is arranged in the recessed portion.

26. An image display device according to claim 21, wherein a semiconductor device which is connected to the wiring is mounted on the second wiring printed circuit board.

27. An image display device according to claim 21, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, and
    the second wiring printed circuit board constitutes a scanning signal driving circuit which supplies the scanning signals to the gate signal lines.

28. An image display device according to claim 21, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof, and
    the second wiring printed circuit board constitutes a video signal driving circuit which supplies the video signals to the drain signal lines.

29. An image display device according to claim 21, wherein the image display panel includes gate signal lines which supply scanning signals to groups of pixels, each consisting of respective pixels arranged in parallel in one direction, and drain signal lines, which supply video signals to respective pixels to which the scanning signals are supplied, on a surface thereof,
    the second wiring printed circuit board includes a printed circuit board which constitutes a scanning signal driving circuit for supplying the scanning signals to the gate signal lines and a printed circuit board which constitutes a video signal driving circuit for supplying video signals to the drain signal lines, and
    the first wiring printed circuit board, which is connected to the scanning signal driving circuit, and the first wiring printed circuit board, which is connected to the video signal driving circuit, are formed as separate printed circuit boards that are independent from each other.

30. An image display device according to claim 21, wherein a dummy printed circuit board, which connects the first wiring printed circuit board and the image display panel, is provided at an end portion of the first wiring printed circuit board.

31. An image display device according to claim 21, wherein the frame has a projection portion which is fitted to the recessed portion of the first wiring printed circuit board.

* * * * *